United States Patent
Strandberg et al.

(10) Patent No.: US 7,603,089 B2
(45) Date of Patent: Oct. 13, 2009

(54) METHODS AND APPARATUS FOR CONDITIONING LOW-MAGNITUDE EVENTS IN COMMUNICATIONS SIGNALS

(75) Inventors: Richard H. Strandberg, Fremont, CA (US); Paul Cheng-Po Liang, Santa Clara, CA (US)

(73) Assignee: Panasonic Corporation, Osaka (JP)

( * ) Notice: Subject to any disclaimer, the term of this patent is extended or adjusted under 35 U.S.C. 154(b) by 511 days.

(21) Appl. No.: 11/505,746

(22) Filed: Aug. 17, 2006

(65) Prior Publication Data

US 2008/0045163 A1 Feb. 21, 2008

(51) Int. Cl.
*H04B 1/02* (2006.01)

(52) U.S. Cl. .............. 455/91; 455/130; 455/150.1; 455/126; 455/323; 375/296; 375/300

(58) Field of Classification Search ............ 455/91, 455/130, 150, 126, 323; 375/296, 300
See application file for complete search history.

(56) References Cited

U.S. PATENT DOCUMENTS

| | | |
|---|---|---|
| 5,696,794 A | 12/1997 | O'Dea |
| 5,805,640 A | 9/1998 | O'Dea et al. |
| 5,991,337 A * | 11/1999 | Giles .................. 375/222 |
| 6,104,761 A | 8/2000 | McCallister et al. |
| 6,928,121 B2 | 8/2005 | MacFarlane Shearer, III et al. |
| 6,931,240 B2 * | 8/2005 | Hunton .................. 455/130 |

* cited by examiner

*Primary Examiner*—Sanh D Phu

(57) ABSTRACT

Methods and apparatus for conditioning low-magnitude events in electrical signals. According to an exemplary method, a low-magnitude event occurring in a signal trajectory of a received electrical signal is analyzed. The low-magnitude event is defined by a data point on a signal trajectory having a magnitude that is less than a predetermined signal magnitude minimum. A correction impulse having a correction magnitude and a correction phase is generated based on the magnitude and phase of data points on the signal trajectory that occur prior to and after the occurrence of the low magnitude event. The correction impulse is combined with the original electrical signal in the temporal vicinity of the low-magnitude event, thereby generating a corrected electrical signal having a more controlled bandwidth.

12 Claims, 12 Drawing Sheets

METHODS AND APPARATUS FOR CONDITIONING LOW-MAGNITUDE EVENTS IN COMMUNICATIONS SIGNALS

FIELD OF THE INVENTION

The present invention relates generally to communications signals. More specifically, the present invention relates to conditioning low-magnitude events in communications signals.

BACKGROUND OF THE INVENTION

Radio communication transmitters operate by varying the magnitude and/or phase of a radio frequency (RF) carrier according to an information signal and radiating the modified RF carrier from an antenna. The process of translating information into the magnitude and phase of the RF carrier is known as modulation.

There are various types of modulators that may be used to modulate a digital information stream onto an RF carrier. One commonly used type is the quadrature modulator. FIG. 1 is a block diagram of a prior art quadrature modulator 10. The quadrature modulator 10 comprises an I-channel mixer 100, a Q-channel mixer 102, a local oscillator (LO) 104, a phase shifter 106 and a summer 108. The I-channel mixer 100 is configured to receive an in-phase data stream and a radio frequency (RF) carrier signal from the LO 104. At the same time, the Q-channel mixer 102 is configured to receive a quadrature-phase data stream and a ninety-degree phase shifted version of the carrier signal, by operation of the ninety-degree phase shifter 106. The I- and Q-channel mixers 100 and 102 upconvert the in-phase and quadrature-phase data streams to the frequency of the RF carrier. The summer 108 combines the upconverted in-phase and quadrature-phase signals and feeds the sum to an input of an RF power amplifier (RFPA) 110. The RFPA 110 amplifies the upconverted sum and feeds the upconverted sum to an antenna 112, which radiates the modulated RF carrier for reception by an RF receiver.

Another type of modulator is the polar modulator. A polar modulator processes the modulating signals in polar coordinates, rather than rectangular coordinates as in the quadrature modulator. The ability to process the data in polar, rather than rectangular, coordinates affords the polar modulator several performance advantages over the quadrature modulator. Some of these advantage include higher efficiency, wider dynamic range, less complex and expensive implementation of multi-mode capabilities, enhanced spectral purity and lower susceptibility to temperature variations.

FIG. 2 is a block diagram showing the principle components of a typical prior art polar modulator 20. The polar modulator 20 receives I and Q data streams from a baseband modulator 200. A rectangular-to-polar converter 202 receives the I and an Q data streams and generates an envelope signal containing amplitude information of the input signal and a constant-amplitude phase change signal containing phase information of the input signal. The envelope signal is then processed in an amplitude path of the modulator 20, while the phase change signal is processed separately in a phase path of the modulator 20.

The amplitude path of the polar modulator 20 includes an amplitude-path digital-to-analog converter (DAC) 204 and an amplitude modulator 206. The phase path of the polar modulator 20 includes a phase-path DAC 208 and a voltage controlled oscillator (VCO) 210. The output of the amplitude modulator 206 in the amplitude path of the modulator is coupled to the power input of an RFPA 212, and the output of the VCO 210 is coupled to an RF input of the RFPA 212.

During operation, the phase-path DAC 208 is configured to receive the phase change signal from the rectangular-to-polar converter 430, and convert the phase change signal into an analog signal. The VCO 210 responds to the analog signal by generating a constant-amplitude phase modulated RF drive signal, which is coupled to the RF input of the RFPA 212. Meanwhile, in the amplitude path, the amplitude-path DAC 204 converts the magnitude signal into an analog signal. This analog signal is fed to the amplitude modulator 206, which modulates a power supply voltage (Vsupply), according to the amplitude of the amplitude signal, thereby generating a modulated power supply voltage signal.

The modulated power supply voltage signal from the amplitude path of the polar modulator 20 is coupled to the power input of the RFPA 212, and the RFPA 212, configured for switched mode operation, is driven into heavy compression. The RF output power of the polar modulator 20 is therefore directly proportional to the amplitude signal modulating the power input of the RFPA 212. In addition to the capability of transferring the amplitude information of non-constant envelope modulations such as EDGE (Enhanced Data Rates for GSM (Global System for Mobile Communications) Evolution), the modulated power supply voltage signal also provides accurate power level control.

While the polar modulator has a number of performance advantages over the more conventional quadrature modulator, the magnitude and phase components typically have a much higher bandwidth compared to the in-phase and quadrature-phase components of a quadrature modulator. High bandwidths are undesirable since they increase the rate at which the data must be processed. Higher processing rates require more sophisticated components, which add to the overall cost of the design. Moreover, and notwithstanding the added cost, processing rates are limited by physical limitations of the modulator hardware. So, it is not always an option to avoid high bandwidth related problems simply by providing a more sophisticated design.

In a polar modulator, in particular, the bandwidth of signals in both the amplitude and phase paths must be carefully controlled to ensure proper polar modulator operation. Low-magnitude events in the amplitude path of a polar modulator require that the amplitude path include an amplitude modulator having a large dynamic range. However, it is difficult to design an amplitude modulator having the ability to both provide a large dynamic range, while at the same time providing accurate signal levels.

Low-magnitude events are also susceptible to rapid phase changes. Indeed, for signal magnitudes that pass through zero, the signal phase can change by 180 degrees nearly instantaneously. Rapid phase changes cause the bandwidth of the phase component signal in the phase path of the polar modulator to increase. Unfortunately, high phase bandwidths require high signal processing rates, which either adds to the cost of components in the phase signal path or are not possible with commonly available hardware.

Because low-magnitude events strongly affect signal bandwidth, prior art efforts have focused on ways to reduce or eliminate low-magnitude events in modulators. One prior art approach contemplates "hard limiting" the information signal data, so that low-magnitude events cannot even occur in the first place. Unfortunately, this approach, at least by itself, undesirably leads to substantial spectral regrowth, i.e., a large adjacent channel leakage ratio (ACLR). Moreover, the approach fails to adequately address the phase bandwidth of the signal. As discussed above, rapid changes in phase can significantly increase the phase bandwidth of the signal.

Another approach to limiting low-magnitude events involves injecting pulses having predefined characteristics into the signal stream, at times when it is expected that a low-magnitude event will occur. Such a technique is proposed in U.S. Pat. No. 5,805,640 to O'Dea et al., which describes adding pulses at half-symbol timing instants. A major drawback with that approach, however, is that the signal envelope at T/2 may be greater than a predetermined low-magnitude threshold, but still have a magnitude that actually falls below the threshold at a time or times other than T/2 timing. Consequently, this "T/2 method" is susceptible to entirely missing low-magnitude events.

Yet another approach to reducing low-magnitude events is disclosed in U.S. Pat. No. 5,696,794 to O'Dea et al. In this second O'Dea et al. patent, pulses are added to symbols adjoining a low-magnitude event determined to have occurred at T/2 timing. A significant drawback with that approach, however, is that adding the pulses increases the error vector magnitude (EVM) of the "corrected" symbols. A large EVM is undesirable, since it is an indication that the corresponding symbol being transmitted does not map correctly to the ideal modulation constellation point. Deviation from the ideal constellation point makes it difficult for a receiver to detect the intended symbol and can lead to errors.

Because both O'Dea et al. approaches are limited to symbol rate conditioning, they are prone to error, provide very rough corrections at best and, for many modern applications, simply do not properly address low-magnitude events. Indeed, many modern mobile communications technologies, like UMTS (Universal Mobile Telecommunications Systems) and HSDPA (High-Speed Downlink Packet Access)) display signal trajectories that often have low-magnitude events falling below a predetermined desired threshold. Accordingly, it would not be a safe assumption to simply conclude that low-magnitude events occur only at T/2 timing.

What is needed, therefore, is a method of conditioning low-magnitude events in communications signals that is not limited to T or T/2 timing, does not significantly increase EVM, and which does not unduly degrade other basic signal characteristics such as PSD (Power Spectral Density) and ACLR.

SUMMARY OF THE INVENTION

Methods and apparatus for conditioning low-magnitude events in electrical signals are disclosed. According to an exemplary embodiment, a method includes analyzing a low-magnitude event occurring in a signal trajectory of a received electrical signal. The low-magnitude event is defined by a data point on a signal trajectory having a magnitude that is less than a predetermined signal magnitude minimum. A correction impulse having a correction magnitude and a correction phase is generated based on the magnitude and phase of data points on the signal trajectory that occur prior to and after the occurrence of the low magnitude event. The correction impulse is combined with the original electrical signal in the temporal vicinity of the low-magnitude event, thereby generating a corrected electrical signal having a more controlled bandwidth.

Other features and advantages of the present invention will be understood upon reading and understanding the detailed description of the preferred exemplary embodiments in conjunction with the drawings, a brief description of which are provided below.

DETAILED DESCRIPTION

Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

Figure 1:
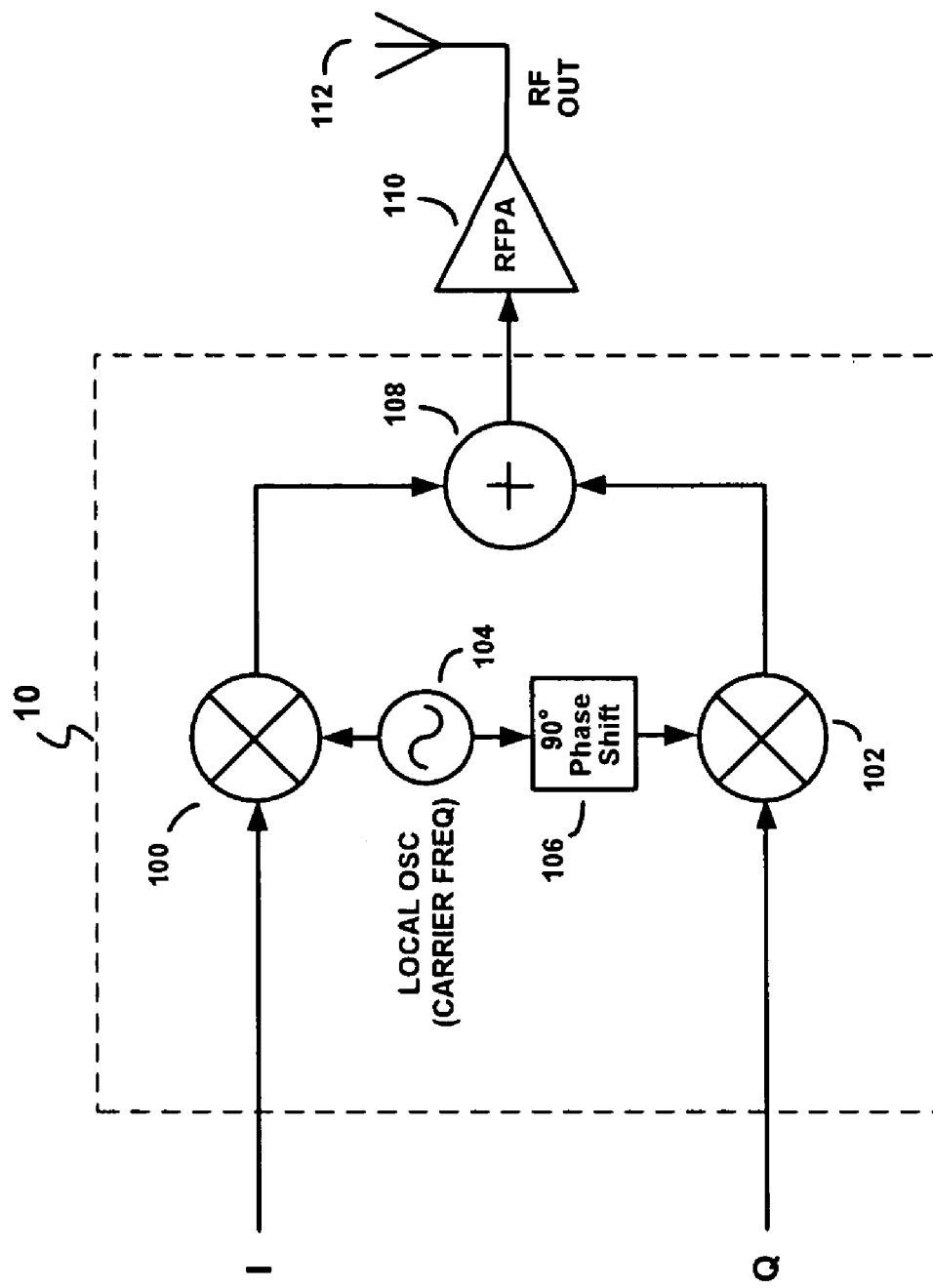
FIG. 1 is a block diagram of a prior art quadrature modulator.
Figure 2:
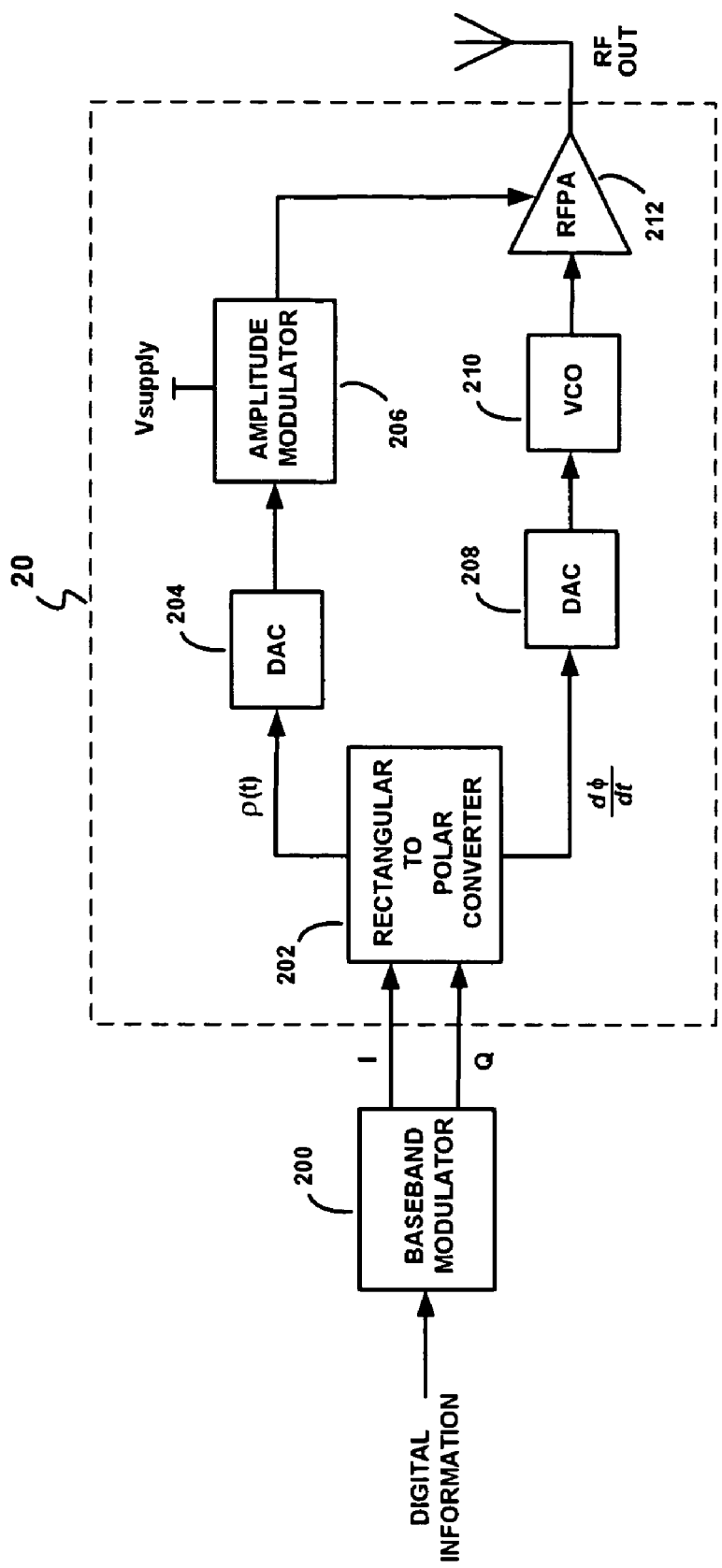
FIG. 2 is a block diagram showing the principle components of a typical prior art polar modulator.
Figure 3:
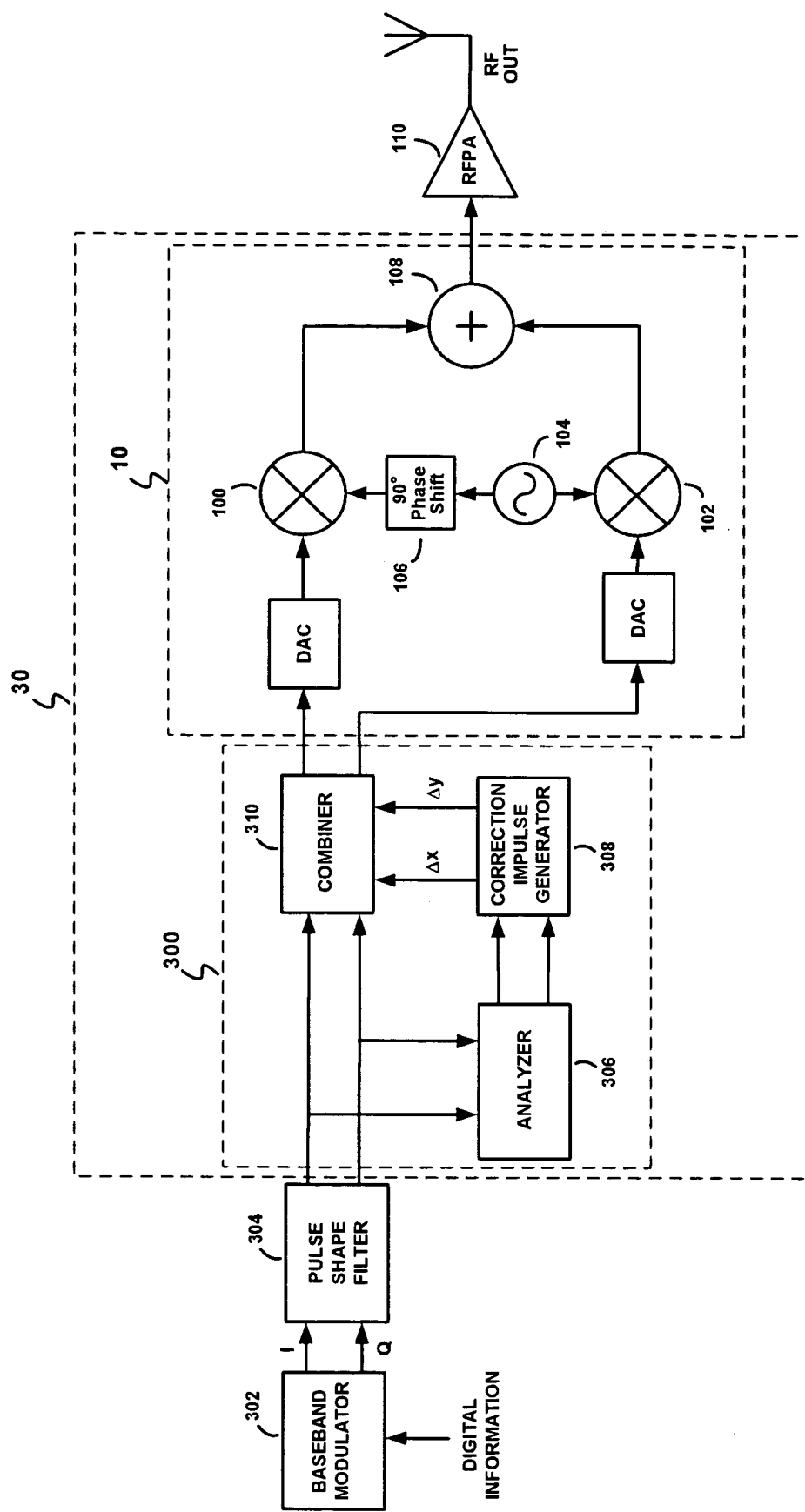
FIG. 3 shows an exemplary modulator and signal conditioning apparatus, according to an embodiment of the present invention.

Referring to FIG. 3, there is shown an exemplary modulator and signal conditioning apparatus 30, according to an embodiment of the present invention. The modulator and signal conditioning apparatus 30 comprises a quadrature modulator 10, similar to that shown in FIG. 1, and a signal conditioner 300. The signal conditioner 300 comprises an analyzer 306, a correction impulse generator 308 and a combiner 310 with I and Q channel outputs, which provide in-phase and quadrature-phase signals to the I and Q channel inputs of the quadrature modulator 10. According to an embodiment of the invention, one or more of the processes performed by the various components of the signal conditioner 300 is (are) implemented as a digital signal processor (DSP), e.g., in a programmable logic device such as a field programmable gate array (FPGA). Those of ordinary skill in the art will readily appreciate and understand that any one or more of these processes can be implemented as software, firmware and/or other hardware.

During operation digital information is converted to I and Q signals by a baseband processor 302. The I and Q signals are then pulse-shaped by a pulse shape filter 304. The pulse shape filter 304 "shapes" the digital pulses so that their edges are not so steep, thereby limiting the bandwidth to reasonable limits.

Pulse shaped digital data from the pulse shape filter 304 is fed to the analyzer 306 of the signal conditioner 300. The analyzer 306 analyzes low-magnitude events determined to have fallen below a predetermined magnitude threshold. The correction impulse generator 308 generates a correction impulse in response to a low-magnitude event. The combiner 310 then combines the correction impulse with the uncorrected low-magnitude I and Q channel signal data, thereby removing the low-magnitude event prior to the data being upconverted by the quadrature modulator and amplified by the RFPA 110.

Figure 4:
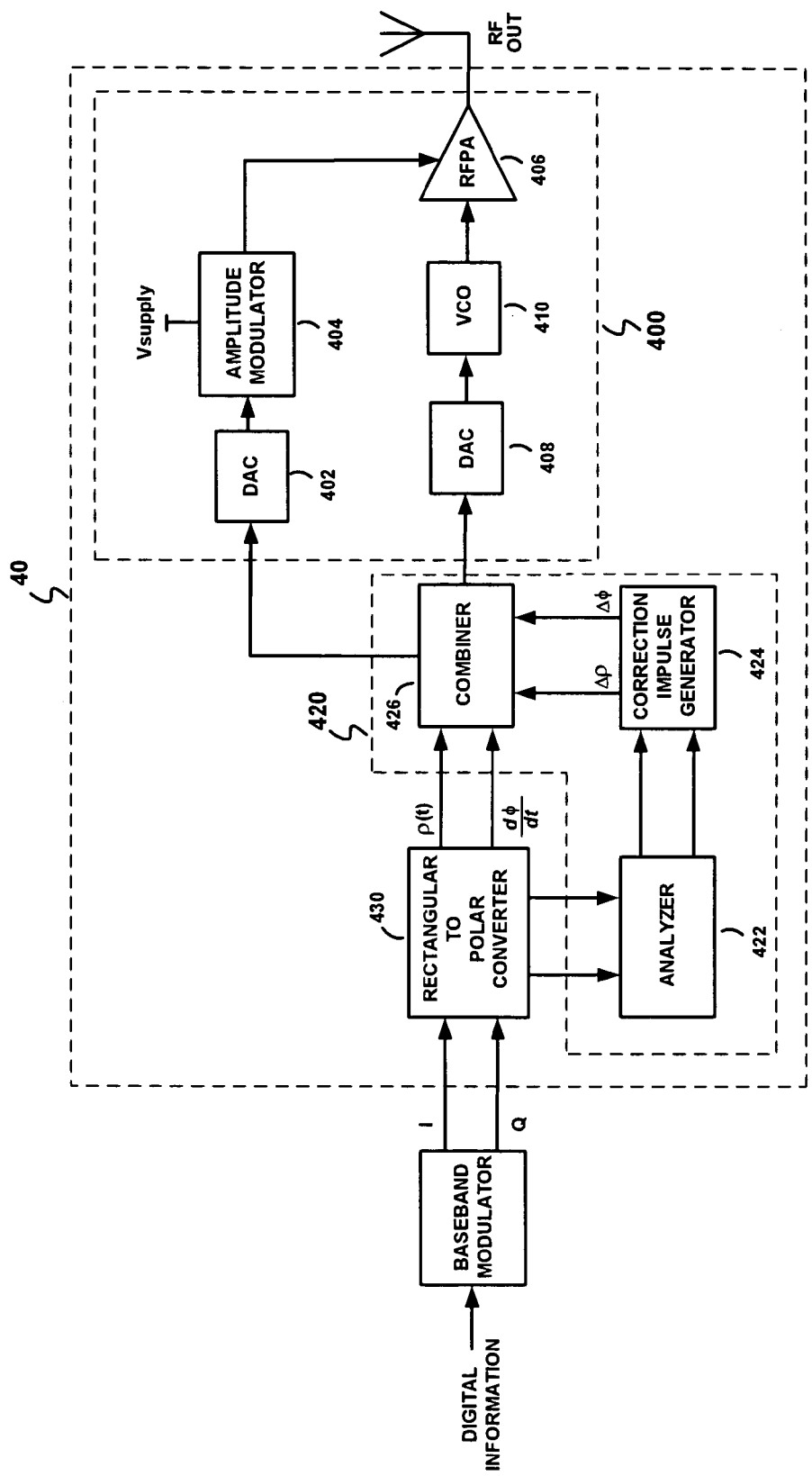
FIG. 4 shows an exemplary modulator and signal conditioning apparatus, according to another embodiment of the present invention.

FIG. 4 shows an exemplary modulator and signal conditioning apparatus 40, according to another embodiment of the present invention. The modulator and signal conditioning apparatus 40 comprises a polar modulator 400, and a signal conditioner 420. The signal conditioner 420 comprises an analyzer 422, which controls a correction pulse generator 424, and a combiner 426 that combines a low-magnitude event correction impulse to low-magnitude events from a rectangular-to-polar converter 430. The polar modulator 400 has an amplitude path and a phase path. The amplitude path includes a first digital-to-analog converter (DAC) 402 and an amplitude modulator 404 having a power supply input configured to receive a power supply voltage Vsupply and provide a modulated power supply voltage signal, which is coupled to a power setting input of an RFPA 406. The phase path includes a second DAC 408 coupled to a voltage controlled oscillator (VCO) 410. The VCO 410 generates a constant-amplitude phase modulated signal which is coupled to an RF input of the RFPA 406.

Envelope and phase change signals generated by a rectangular-to-polar converter 430 are fed to inputs of the analyzer 422, which analyzes the envelope and phase change signals for occurrences of low-magnitude events in the signal trajectory. In response to an occurrence of a low-magnitude event, the analyzer 422 provides control signals to the correction impulse generator 424, which operates to generate a correction impulse having a correction magnitude A p and a correction phase $\Delta\phi$. The combiner 426 combines the correction impulse with the envelope and phase change signal data to remove or increase the magnitude of the low-magnitude event. Once the correction impulse is combined with the envelope and phase change signal data, the amplitude and phase change components of the corrected signal data are then fed to the amplitude and phase paths of the polar modulator 400, which modulates and upconverts the data to an RF signal suitable for transmission over a wireless link. Exemplary methods for analyzing low-magnitude events and for generating correction impulses are discussed in more detail below.

Figure 5:
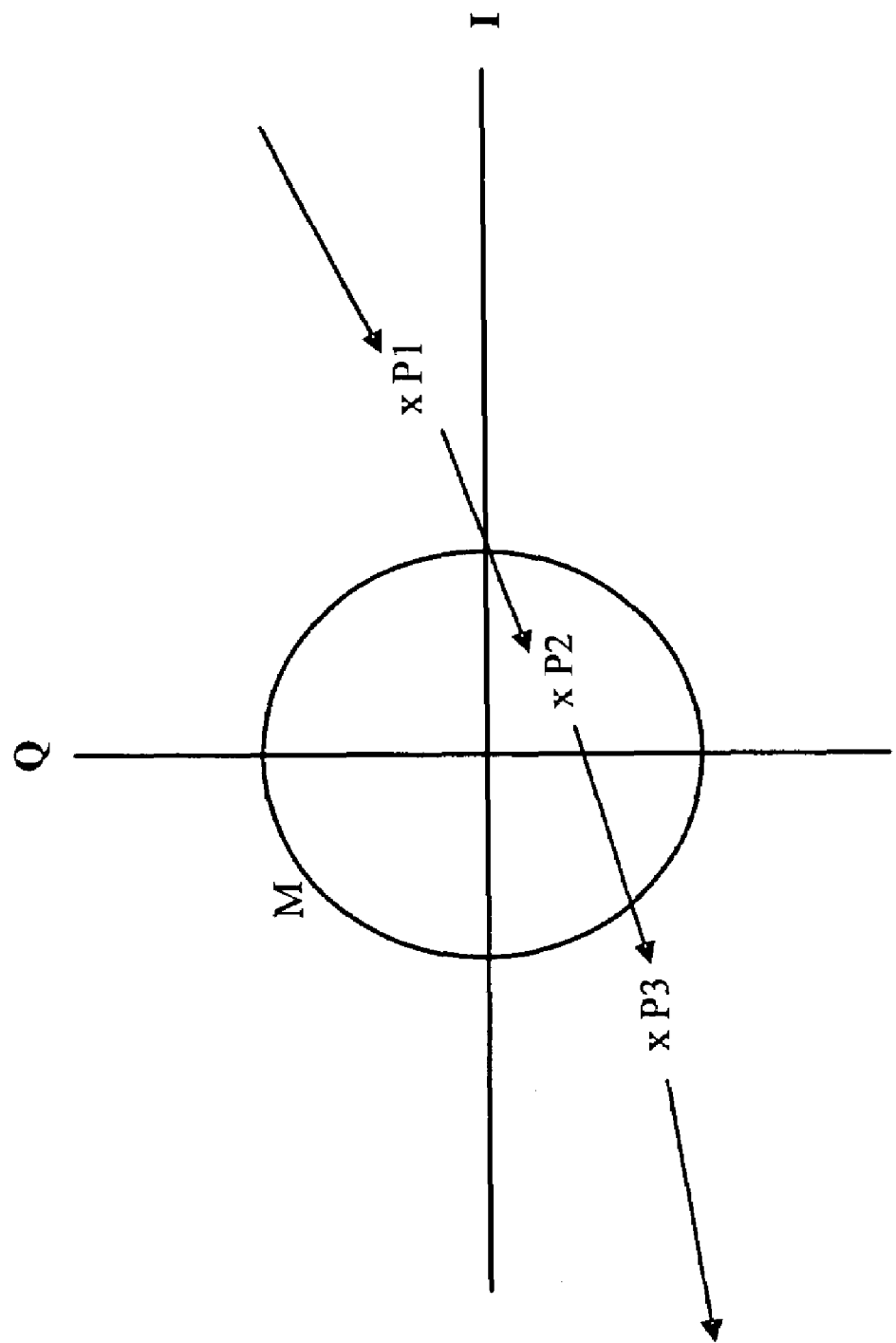
FIG. 5 shows an I-Q diagram including an exemplary signal trajectory defined by data points P1, P2 and P3.

FIG. 5 shows an I-Q diagram including an exemplary signal trajectory defined by data points P1, P2 and P3. Point P1 occurs before point P2 and point P3 occurs after point P2. Data points P1, P2 and P3 correspond to symbol-mapped constellation points or to any data point along the signal trajectory. Also shown in FIG. 5 is a minimum desired magnitude threshold, M. Any constellation point or data sample point having a magnitude less than this minimum magnitude threshold is a low-magnitude event. As can be seen, point P2 has a magnitude that is less than the minimum desired magnitude threshold, M. Accordingly, point P2 represents a low-magnitude event.

Figure 6:
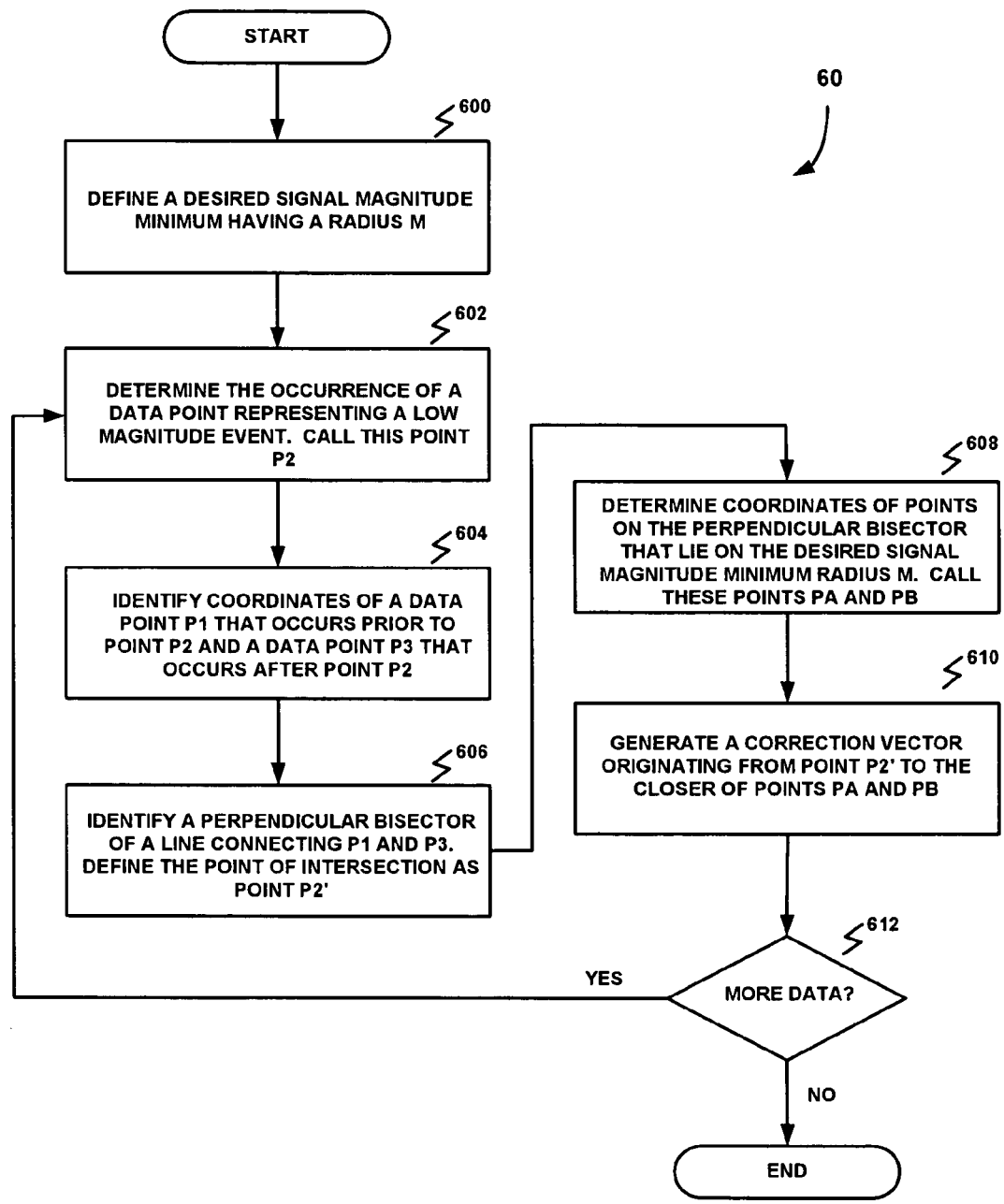
FIG. 6 is a flowchart highlighting steps performed by a signal conditioning method, according to an embodiment of the present invention.
Figure 7:
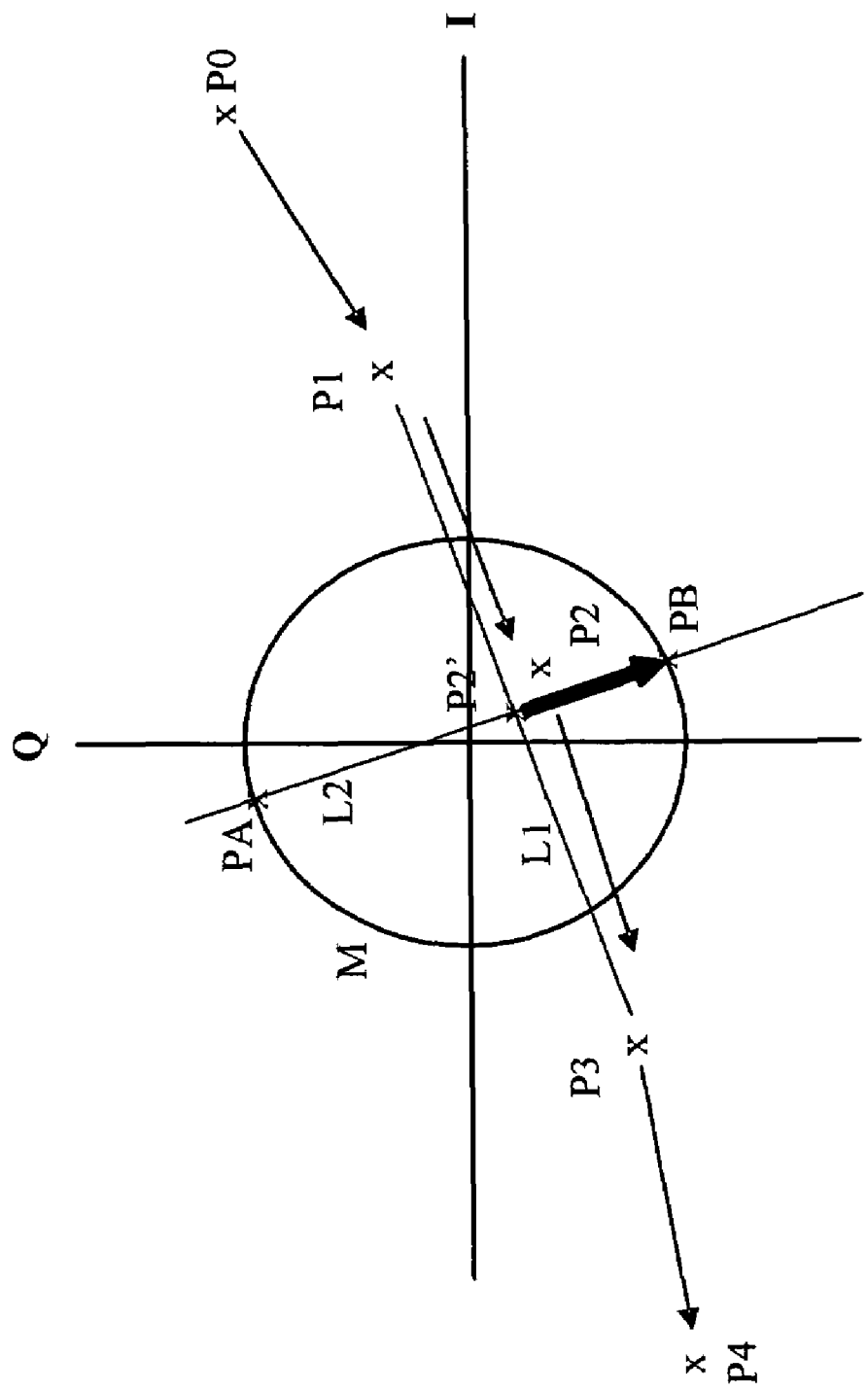
FIG. 7 is an I-Q diagram illustrating generation of a correction impulse by performing the method shown in FIG. 6.

According to an embodiment of the present in invention, a method for altering the signal trajectory of a signal to increase the magnitude of low-magnitude events is disclosed. FIG. 6 is a flowchart highlighting steps performed by this method 60 of the present invention. The various steps of the method 60 may be performed by, for example, the signal conditioner 420 of the modulator and signal conditioning apparatus 40 shown in FIG. 4. First, at step 600, a desired signal magnitude minimum is defined. This desired signal magnitude is represented as a signal magnitude minimum radius M in FIG. 7. Next, at step 602, the occurrence of a low-magnitude event in the signal trajectory is determined. In FIG. 7, for example, a data point labeled P2 represents a low-magnitude event. At step 604, a data point P1 occurring prior to the occurrence of the low-magnitude event and having a vector magnitude greater than the signal magnitude minimum radius M is identified. Additionally, a data point P3 occurring after the occurrence of the low-magnitude event and also having a vector magnitude greater than the signal magnitude minimum radius M is identified. These data points P1 and P3 are shown in FIG. 7. At step 606, a perpendicular bisector L2 of a line L1 connecting data points P1 and P3 is identified. This point at which the perpendicular bisector L2 intersects with the line L1 connecting data points P1 and P3 is labeled P2' in FIG. 7. As can be seen in FIG. 7, the perpendicular bisector L2 intersects with the circle defining the signal magnitude minimum radius M at points labeled PA and PB. At step 608, it is determined whether P2' is closer to point PA or to point PB, and a correction vector from P2' and the closer of points PA and PB is generated. In the example in FIG. 7, P2' is closer to point PB than it is to point PA, so a vector along the perpendicular bisector originating at P2' and ending at point PB is generated (e.g. by the correction impulse generator 424 in FIG. 4).

At decision 612 in method 60, a decision is made as to whether more data is to be analyzed. If yes, the method proceeds to step 602, where the occurrence of another low-magnitude event in the signal trajectory is determined. If no, the method ends.

The correction vector has a correction magnitude $\Delta\rho$ and a correction phase $\Delta\phi$. The correction magnitude $\Delta\rho$ and the correction phase $\Delta\phi$ are combined with the original signal data at the time of the low-magnitude event (e.g., by the combiner 426 in FIG. 4). The corrected and combined signal data is then fed to the amplitude and phase paths of a polar modulator (e.g. the polar modulator 400 of the modulator and signal conditioning apparatus 40 in FIG. 4). The method 60 then repeats to correct for additional low-magnitude events.

Figure 8:
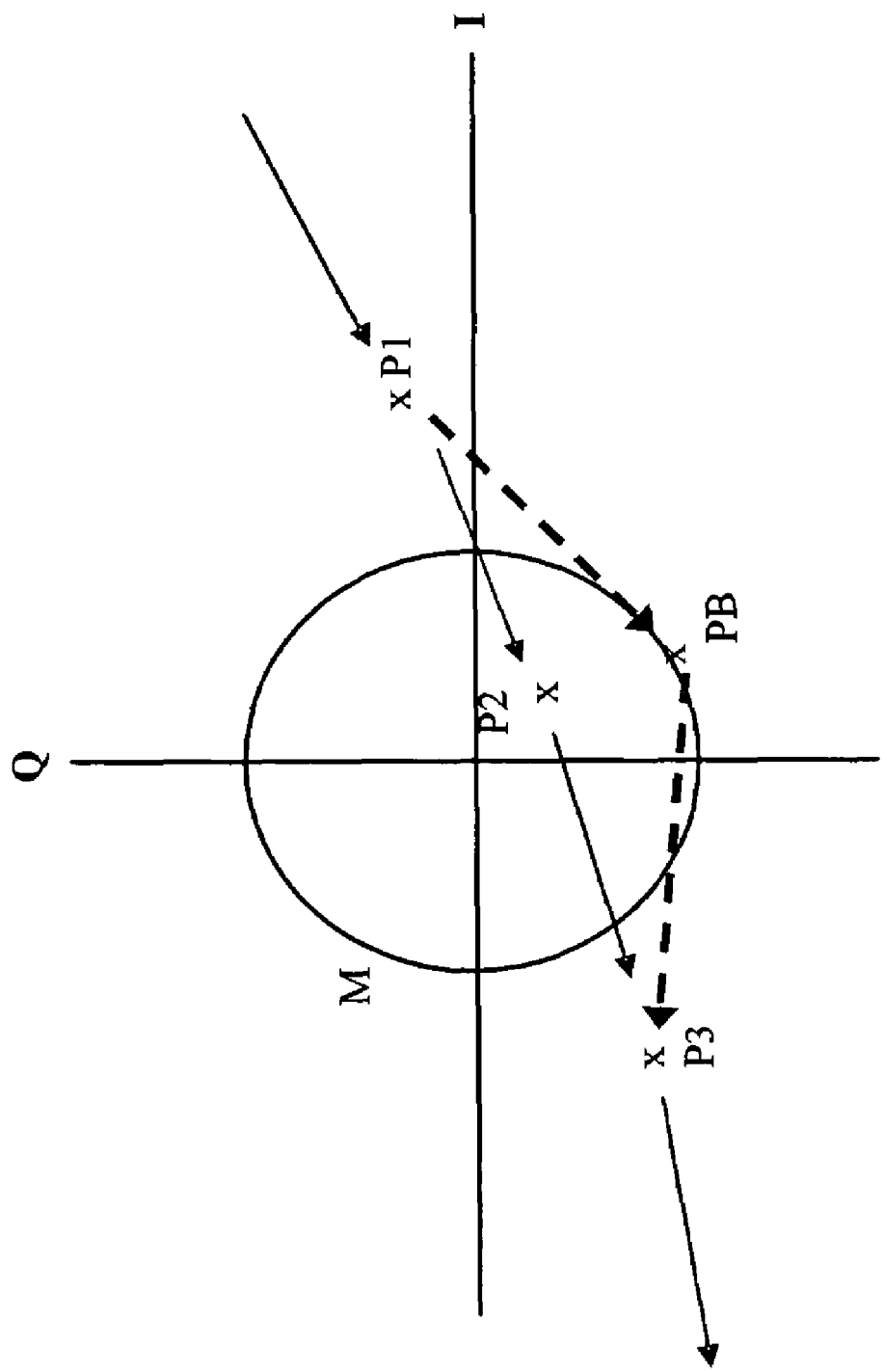
FIG. 8 is an I-Q diagram illustrating how the correction impulse generated by performing the method in FIG. 6 results in an altered signal trajectory.

The effect of combining the correction vector with the original signal data is to alter the trajectory slightly, so that the trajectory does not pass through the low-magnitude event represented by data point P2. The altered signal trajectory for the example just described is shown in FIG. 8. The dashed lines represent the altered signal trajectory. Instead of passing through the low-magnitude event, the modified signal trajectory passes through point PB on the signal magnitude minimum radius M. Because a correction vector (i.e. an impulse) is combined with the original data, rather than a pulse-shaped pulse (e.g., a Nyquist pulse or a root raised cosine pulse) to the original data, as is done in prior art approaches, the error vector magnitude (EVM) of the signal data is not adversely affected to the degree it is in prior art approaches.

According to another embodiment of the invention, a method for altering the signal trajectory of a signal to increase the magnitude of low-magnitude events is disclosed. This method is similar to the method 60 in FIG. 6, but also includes steps that generates "averaged tails" for data points that occur prior to and after the occurrence of a low-magnitude event. As explained below, the averaged tails operate to alter data points in the proximity of a data point representing a low-magnitude event, to further ensure that low-magnitude events do not occur in the altered signal trajectory.

Figure 9:
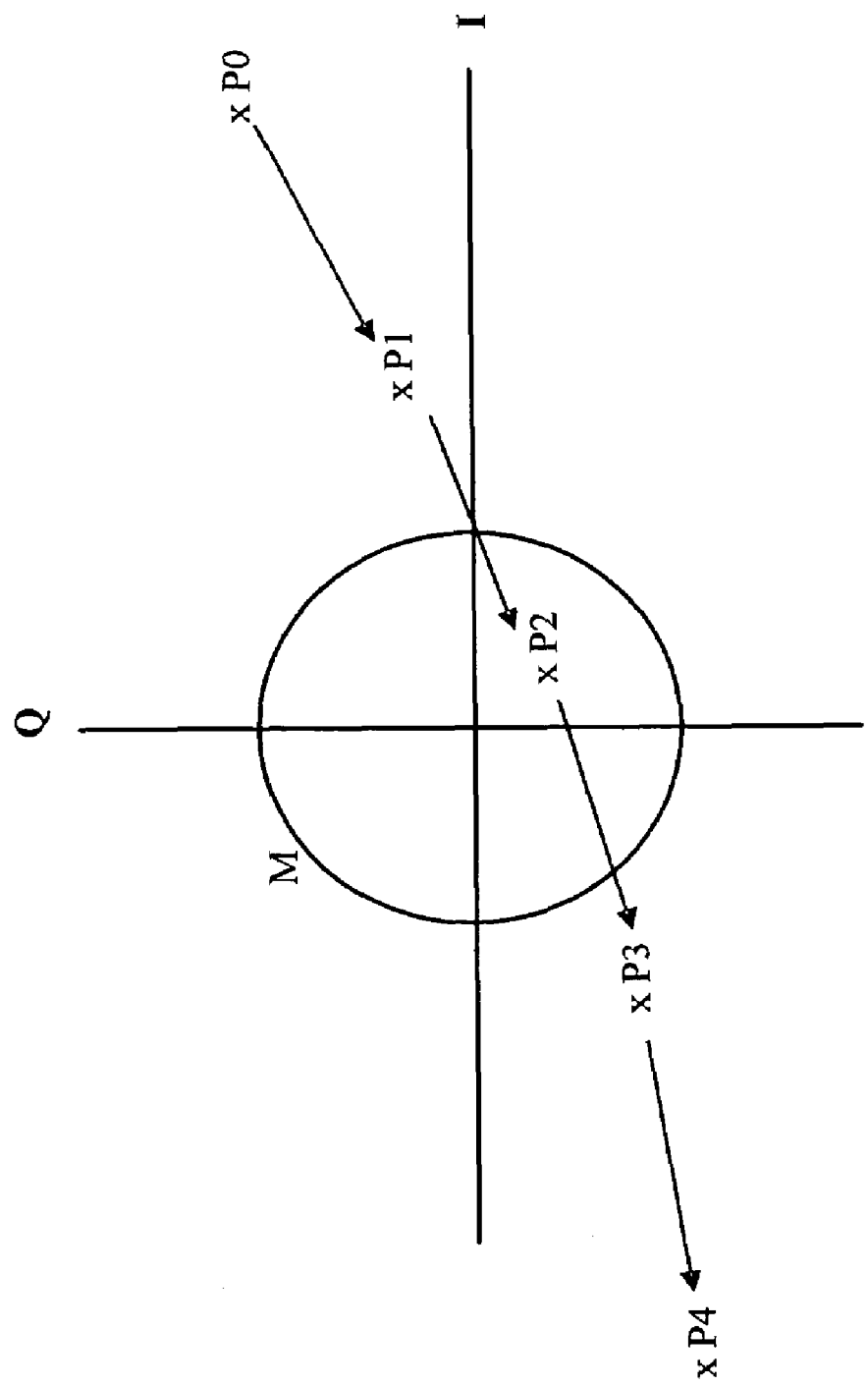
FIG. 9 is an I-Q plot including an exemplary signal trajectory defined by data points P0, P1, P2, P3 and P4.

FIG. 9 is an I-Q plot including an exemplary signal trajectory defined by data points P0, P1, P2, P3 and P4. Data points P1, P2 and P3 correspond to symbol-mapped constellation points or to any data point along the signal trajectory. The circle labeled with the letter M represents the desired minimum threshold, i.e., the minimum magnitude of which a data point on the signal trajectory should have. Any symbol-mapped constellation point or data point having a magnitude less than this minimum magnitude threshold is a low-magnitude event. In this example, data point P2 has a magnitude that is less than the minimum desired magnitude threshold, M, and therefore represents a low-magnitude event.

Figure 10:
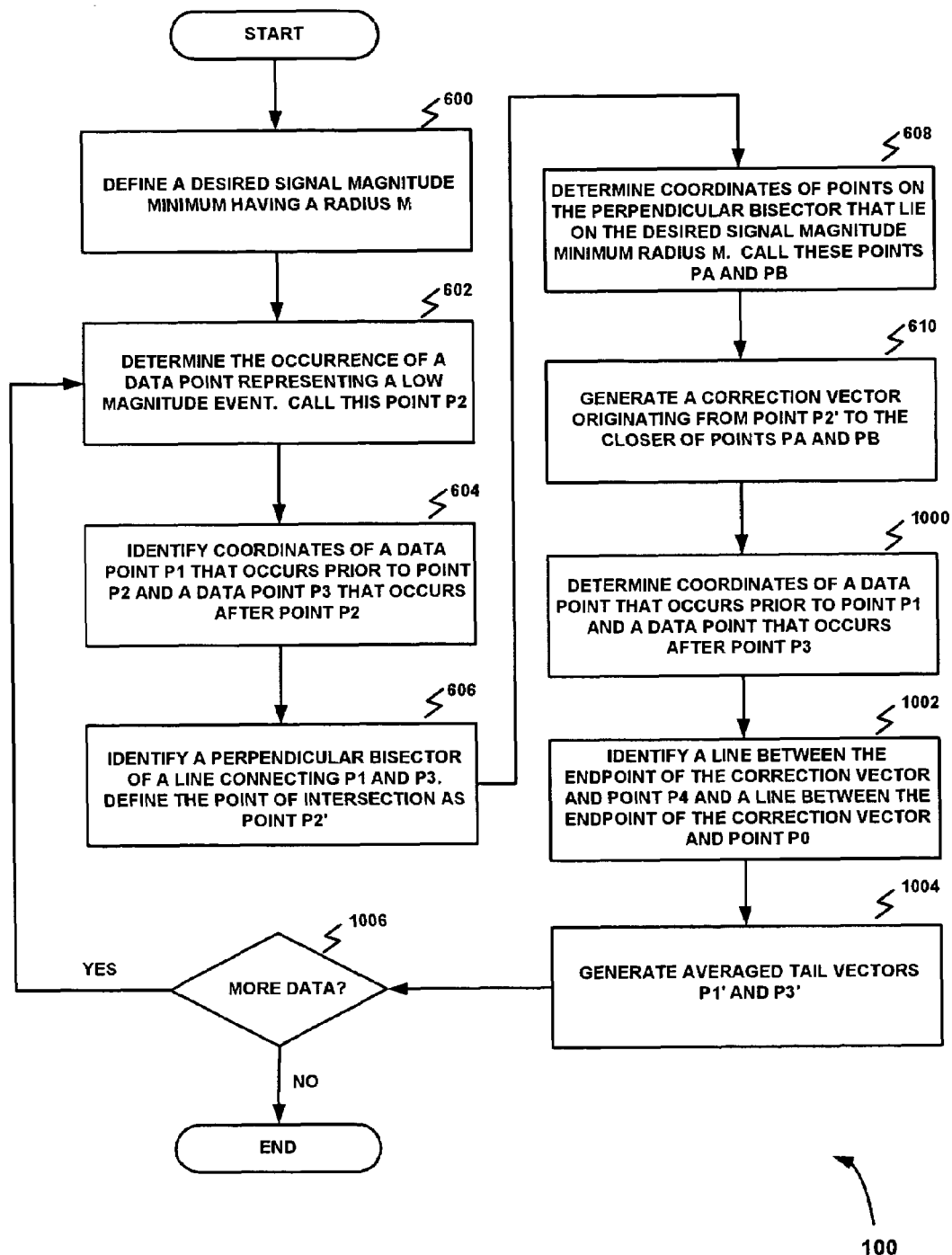
FIG. 10 is a flowchart highlighting steps performed by a signal conditioning method, according to another embodiment of the present invention.
Figure 11:
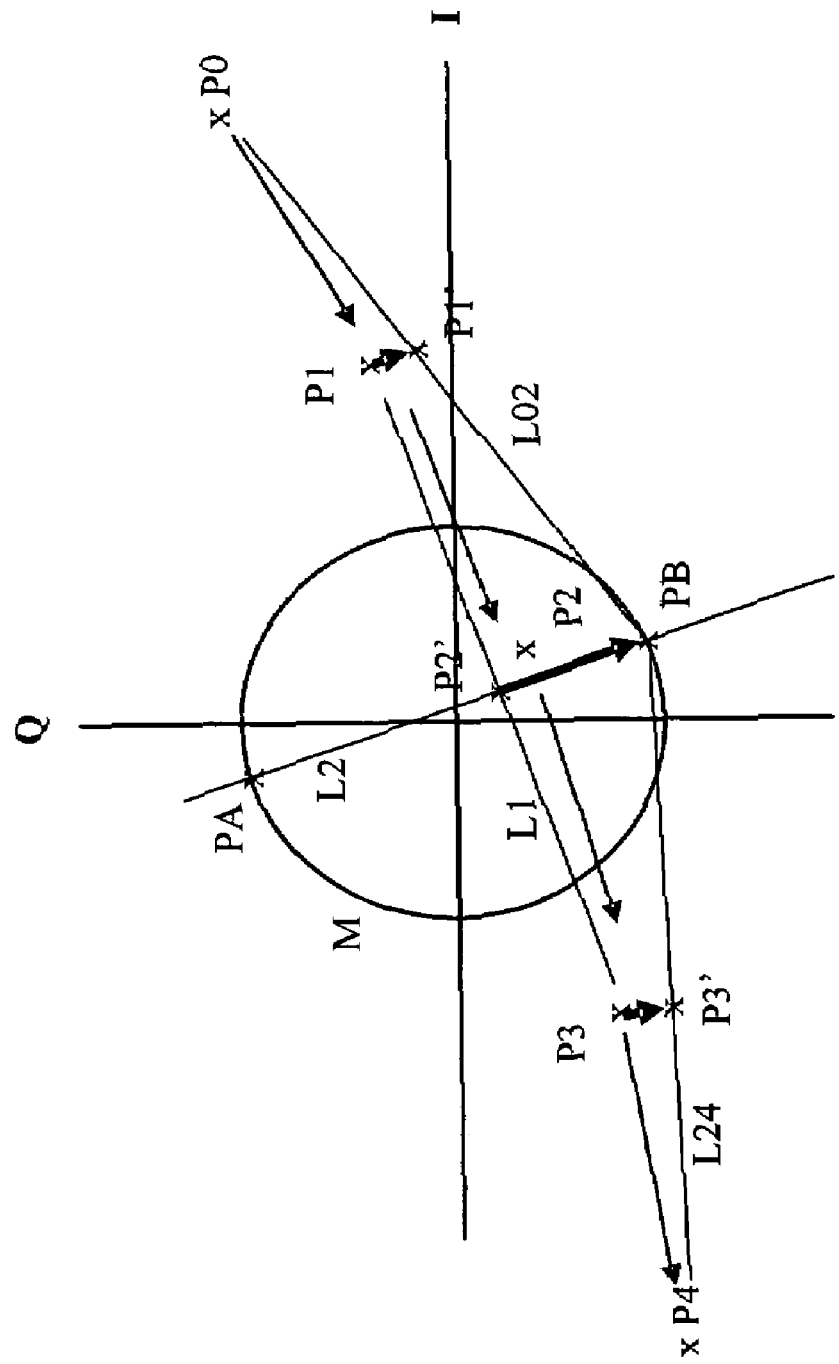
FIG. 11 is an I-Q diagram illustrating generation of a correction impulse and averaged tails by performing the method shown in FIG. 10.

FIG. 10 is a flowchart highlighting various steps performed by this method 100 of the present invention. The various steps of the method 100 may be performed by, for example, the signal conditioner 420 of the modulator and signal conditioning apparatus 40 shown in FIG. 4. Steps 600 through 610 are the same as in the method 60 in FIG. 6. At step 1000, coordinates of a data point P0, which occurs prior to point P1, and coordinates of a data point P4, which occurs after point P3 are determined. Next, at step 1002, and as shown in FIG. 11, a line L24 from point PB (which in this example is closer to P2' than is point PA) to point P4 is identified, and a line L02 from point PB to point P0 is identified. Then, at step 1004, a correction vector between point P3 and the midpoint of the line segment connecting points PB and P4 is generated. Similarly, a correction vector between point P1 and the midpoint of the line segment connecting points PB and P0 is generated. These two correction vectors can be characterized as "averaged tails", which further modify the leading an trailing tails of the signal trajectory in the temporal vicinity of the low-magnitude event.

The primary correction vector connecting point P2' to point PB has a correction magnitude $\Delta\rho$ and a correction phase $\Delta\phi$. The averaged tails also have correction magnitudes and correction phases for points P1 and P3. The correction magnitudes and phases of the primary correction vector and the averaged tails are combined with the original signal data (e.g. by the combiner 426 in FIG. 4) to remove the low-magnitude event. The corrected and combined signal data is then fed to the amplitude and phase paths of a polar modulator (e.g. the polar modulator 400 of the modulator and signal conditioning apparatus 40 in FIG. 4).

At decision 1006 in method 100, a decision is made as to whether more data is to be analyzed. If yes, the method proceeds to step 602, where the occurrence of another low-magnitude event in the signal trajectory is determined. If no, the method ends.

Figure 12:
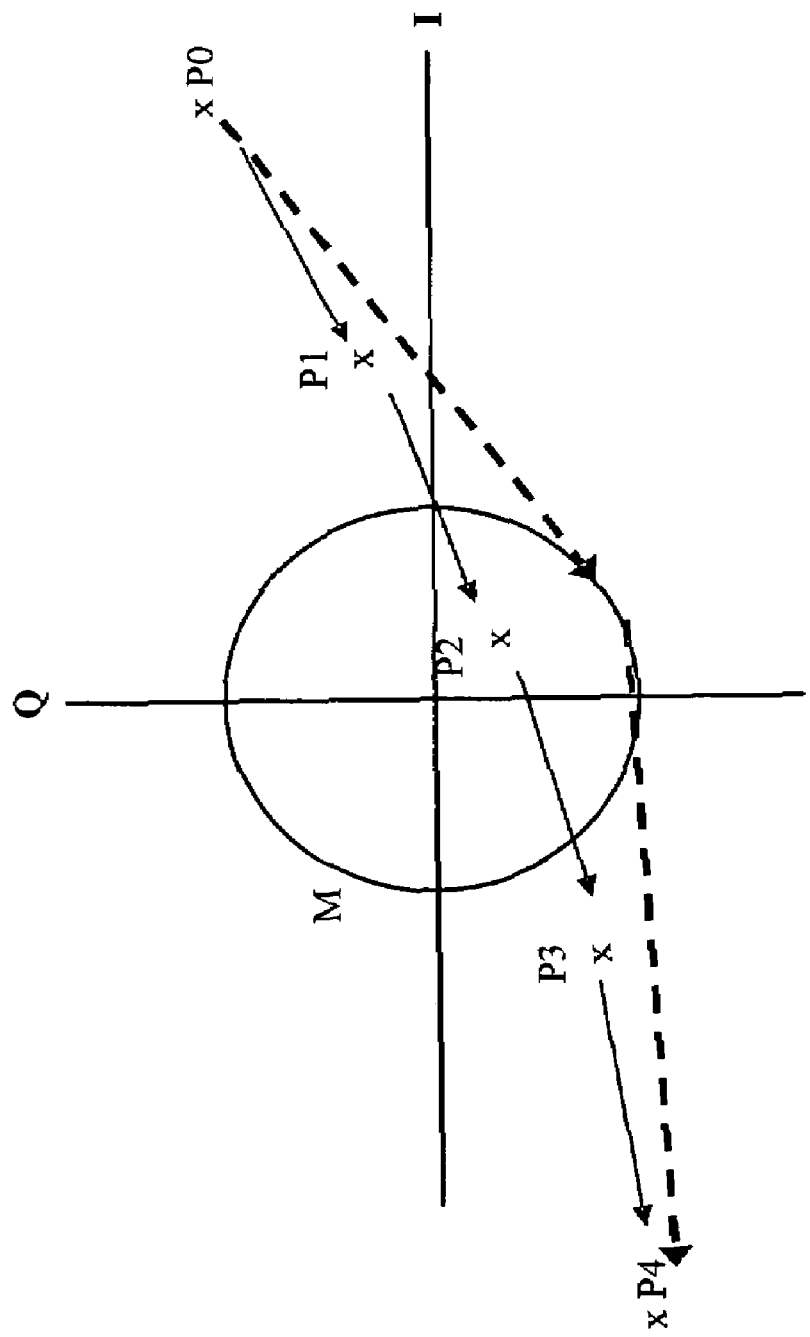
FIG. 12 is an I-Q diagram illustrating how the correction impulse generated by performing the method in FIG. 10 results in an altered signal trajectory.

The effect of combining the correction vector and the averaged tails with the original signal data is to alter the trajectory slightly, so that the trajectory does not pass through the low-magnitude event represented by data point P2. The altered signal trajectory for the example just described is shown in FIG. 12. The dashed lines represent the altered signal trajectory. Instead of passing through the low-magnitude event, the modified signal trajectory passes through point PB on the signal magnitude minimum radius M. The averaged tails have the effect of further removing the signal trajectory from within the signal magnitude minimum radius M circle. Because the correction vectors (i.e. an impulses) are combined with the original data, rather than pulse-shaped pulses (e.g., Nyquist or a root raised cosine pulses), as is done in prior art approaches, the error vector magnitude (EVM) of the signal data is not adversely affected to the degree it is in prior art approaches.

While the foregoing is directed to certain preferred embodiments of the present invention, other and further embodiments of the invention may be devised without departing from the basic scope of the invention. Moreover, the features of one or more embodiments of the invention may be combined with one or more features of other embodiments of the invention without departing from the scope of the invention.

What is claimed is:

1. A method for conditioning an electrical signal, comprising:
   providing a processor programmed with instructions for:
      analyzing a low-magnitude event occurring in a signal trajectory, said low-magnitude event defined by a first data point on the signal trajectory having a magnitude that is less than a predetermined signal magnitude minimum;
      generating a correction impulse having a correction phase and a correction magnitude that depend on a magnitude and a phase of a second data point on the signal trajectory that occurs before the occurrence of the low magnitude event, and a magnitude and a phase of a third data point on the signal trajectory that occurs after the occurrence of the low magnitude event; and
      using the correction impulse to condition the first data point.

2. The method of claim 1 wherein the first data point corresponds to a symbol-mapped constellation point.

3. The method of claim 1 wherein the first data point corresponds to a sampled data point.

4. The method of claim 1 wherein the signal trajectory is represented in an I-Q coordinate system and the predetermined signal magnitude minimum is represented in the I-Q coordinate system as a circle with a predetermined signal magnitude minimum radius, and wherein generating the correction impulse further comprises:
   identifying a perpendicular bisector of a line segment between said second data point and said third data point;
   determining coordinates of points on the perpendicular bisector that lie on the circle defining the predetermined signal magnitude minimum; and
   defining the correction impulse as a vector along the perpendicular bisector having an origin at the midpoint of said line segment and an end terminating at the predetermined signal magnitude minimum radius.

5. A method for conditioning an electrical signal, comprising:
   providing a processor programmed with instructions for:
      defining a desired signal magnitude minimum;
      determining an occurrence of a first data point on a signal trajectory having a magnitude that is less than said desired signal magnitude minimum;
      identifying a second data point on said signal trajectory that occurs prior to the occurrence of the first data point, said second data point having a magnitude that is greater than said desired signal magnitude minimum;
      identifying a third data point on said signal trajectory that occurs after the occurrence of the first data point, said third data point having a magnitude that is greater than said desired signal magnitude minimum; and
      using said second and third data points to generate a correction impulse that increases the magnitude of the first data point.

6. The method of claim 5 wherein the signal trajectory is represented in an I-Q coordinate system and the predetermined signal magnitude minimum is represented in the I-Q coordinate system as a circle with a predetermined signal magnitude minimum radius, and wherein using said second and third data points to generate said correction impulse further comprises:

identifying a perpendicular bisector of a line segment connecting the second and third data points;

determining the coordinates of points on the perpendicular bisector that intersect with the circle defining the predetermined signal magnitude minimum;

defining said correction impulse as a vector from the point at which the perpendicular bisector bisects said line segment to the closer one of the points on the perpendicular bisector that intersect with the circle defining the predetermined signal magnitude minimum.

7. The method of claim 6 wherein the first data point corresponds to a symbol-mapped constellation point.

8. The method of claim 6 wherein the first data point corresponds to a sampled data point.

9. A electrical signal conditioning apparatus, comprising:

means for analyzing a low-magnitude event occurring in a signal trajectory, said low-magnitude event defined by a first data point on the signal trajectory having a magnitude that is less than a predetermined signal magnitude minimum;

means for generating a correction impulse having a correction phase and a correction magnitude that depend on a magnitude and a phase of a second data point on the signal trajectory that occurs before the occurrence of the low magnitude event, and a magnitude and a phase of a third data point on the signal trajectory that occurs after the occurrence of the low magnitude event; and means for using the correction impulse to condition the first data point.

10. The electrical signal conditioning apparatus of claim 9 wherein the first data point corresponds to a symbol-mapped constellation point.

11. The electrical signal conditioning apparatus of claim 9 wherein the first data point corresponds to a sampled data point.

12. A modulator and signal conditioning apparatus, comprising:

a signal conditioner configured to receive an electrical signal from a signal source, said signal conditioner including:

an analyzer operable to analyze a low-magnitude event occurring in a signal trajectory of said received electrical signal, said low-magnitude event defined by a first data point on the signal trajectory having a magnitude that is less than a predetermined signal magnitude minimum;

a correction impulse generator operable to generate a correction impulse having a correction phase and a correction magnitude; and a combiner operable to combine the correction impulse with the electrical signal in the temporal vicinity of the low-magnitude event to generate a corrected electrical signal; and a modulator configured to receive the corrected electrical signal and modulate the corrected electrical signal onto a radio frequency carrier, wherein the signal trajectory is represented in an I-Q coordinate system and the predetermined signal magnitude minimum is represented in the I-Q coordinate system as a circle with a predetermined signal magnitude minimum radius, and wherein generating the correction impulse further comprises:

identifying a perpendicular bisector of a line segment between a pair of data points on the signal trajectory that occur before and after the occurrence of the low magnitude event;

determining coordinates of the first point on the perpendicular bisector that lie on the circle defining the predetermined signal magnitude minimum; and defining the correction impulse as a vector along the perpendicular bisector having an origin at the midpoint of said line segment and an end terminating at the predetermined signal magnitude minimum radius.

* * * * *

UNITED STATES PATENT AND TRADEMARK OFFICE
CERTIFICATE OF CORRECTION

PATENT NO. : 7,603,089 B2
APPLICATION NO. : 11/505746
DATED : October 13, 2009
INVENTOR(S) : Strandberg et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 568 days.

Signed and Sealed this

Fifth Day of October, 2010

David J. Kappos
*Director of the United States Patent and Trademark Office*